(12) United States Patent
Ye

(10) Patent No.: US 6,248,397 B1
(45) Date of Patent: Jun. 19, 2001

(54) METHOD OF DEPOSITING A SILICON OXIDE COATING ON GLASS AND THE COATED GLASS

(75) Inventor: Liang Ye, Southport (GB)

(73) Assignee: Pilkington PLC, St. Helens (GB)

( * ) Notice: Subject to any disclaimer, the term of this patent is extended or adjusted under 35 U.S.C. 154(b) by 0 days.

(21) Appl. No.: 09/185,317

(22) Filed: Nov. 3, 1998

(30) Foreign Application Priority Data

Nov. 4, 1997 (GB) .................................... 9723222

(51) Int. Cl.$^7$ .................................... C23C 16/40
(52) U.S. Cl. ............... 427/167; 427/255.18; 427/255.27; 427/255.37; 65/60.5; 65/60.8
(58) Field of Search ................... 427/167, 166, 427/165, 164, 255.18, 255.27, 255.37; 65/60.5, 60.8, 60.52

(56) References Cited

U.S. PATENT DOCUMENTS

| | | | |
|---|---|---|---|
| 5,089,039 | * 2/1992 | Terneu et al. | 65/60.5 |
| 5,165,972 | * 11/1992 | Porter | 427/108 |
| 5,217,753 | * 6/1993 | Goodman et al. | 427/166 |
| 5,464,657 | * 11/1995 | Athey et al. | 427/108 |
| 5,505,989 | * 4/1996 | Jenkinson | 427/165 |

FOREIGN PATENT DOCUMENTS

| | | |
|---|---|---|
| 0611733 | 8/1994 | (EP) . |
| 05336229 | 7/1995 | (JP) . |
| WO94/18356 | * 8/1994 | (WO) . |

OTHER PUBLICATIONS

K. Fujino, Y. Nishimoto, N. Tokumasu, and K. Maeda; Silicon Dioxide Deposition By Atmospheric Pressure and Low–Temperature VCD Using Teos and Ozone; J. Electrochem. Soc., vol. 137, No. 9, Sep. 1990 Copyright The Electrochemical Society, Inc., pp. 2883–2887.

K. Fujino, Y. Nishimoto, N. Tokumasu, and K. Maeda; Low Temperature and Atmospheric Pressure CVD Using Polysiloxane, OMCTS, and Ozone, J. Electrochem. Soc., vol. 138, No. 12, Dec. 1991 Copyright The Electrochemical Society, Inc., pp. 3727–3732.

Katsuhiro Fujino, Yuko Nishimoto, Noboru Tokumasu and Kazuo Maeda; Low–Temperature Atmospheric–Pressure Chemical Vapor Deposition Using 2, 4, 6, 8–Tetramethyl-cyclotetrasiloxane and Ozone; Jpn. J. Appl. Phys. vol. 33 (1994) Pt. 1, No. 4A, pp. 2019–2024.

H. Wallace Fry, Jeffrey P. West, Stephen Poon, Bruce A. Boeck, Chris C. Yu; Applicatins of APCVD TEOS/$O_3$ Thin Films In ULSI IC Fabrication; Solid State Technology, Mar. 1994, pp. 31–40.

Patent Abstracts of Japan JP 07 187714(Ichiro), Published Jul. 25, 1995, No page numbers.

Patent Abstracts of Japan 05 281534 (Kazuo), Published Oct. 29, 1993, No page numbers.

* cited by examiner

*Primary Examiner*—Shrive Beck
*Assistant Examiner*—Bret Chen
(74) *Attorney, Agent, or Firm*—Marshall & Melhorn, LLC

(57) ABSTRACT

A method of depositing a silicon oxide coating on hot glass at a temperature below 600° C. comprising contacting the hot glass with a gaseous mixture of a source of silicon and oxygen enriched with ozone. Preferably, the hot glass in the form of a hot glass ribbon is contacted with the gaseous mixture during the float glass production process downstream of the float bath. Preferred sources of silicon are silanes, alkylsilanes, alkoxysilanes and siloxanes.

9 Claims, No Drawings

METHOD OF DEPOSITING A SILICON OXIDE COATING ON GLASS AND THE COATED GLASS

The invention relates to coating glass, and especially to coating flat glass with silicon oxide at temperatures below float bath temperatures.

It has been known to deposit silicon oxide coatings on glass at float bath temperatures (around 600° C. and above) using a gaseous mixture of silane, ethylene and usually an oxygen containing gas such as $CO_2$ (see, for example, GB 1 573 154, EP 0 275 662B and EP 0 348 185B), and more recently it has been proposed, in EP 0 611 733A2, to deposit mixed coating layers containing both tin oxide and silicon oxide using, inter alia, alkoxysilane compounds as the source of the silicon oxide, with an accelerant to increase the rate of growth of the coating. EP 0 611 733A2 discloses accelerants for coating systems operating above 1000° F. (typically at float bath temperatures), and suggests the use of a wide range of accelerants including Lewis acids, Lewis bases, water, certain compounds of nitrogen, phosphorus, boron and sulphur of specified structural formula, certain compounds of aluminum of specified structural formula, and ozone. The only accelerants used in the Examples, which are all carried out at glass temperature of 1200° F. (650° C.), are trialkylphosphites.

Unfortunately, the processes known for depositing silicon oxide (especially silicon oxides containing a high proportion of oxygen resulting in a refractive index of 1.5 or less) at substantially atmospheric pressure suffer from one or more of the following disadvantages when used to deposit coatings on hot glass at temperatures at or below float bath temperatures, especially temperatures below 550° C.

(a) low coating growth rate,
(b) expensive reactants,
(c) tendency for gas phase deposition of the reactants resulting in unacceptable particulate formation,
(d) explosion hazards in handling the reactant gas mixture used.

We have now found that one or more of these disadvantages may be overcome, or at least strongly alleviated, by using a mixture of a source of silicon and oxygen enriched with ozone to deposit the coatings.

According to an aspect of the present invention, there is provided a method of depositing a silicon oxide coating on hot glass at a temperature below 600° C. comprising contacting the hot glass with a gaseous mixture of a source of silicon and oxygen enriched with ozone.

The silicon oxide coating may be stoichiometric or non-stoichiometric and may include components, for example nitrogen, carbon, and organic moeities. The method will usually be performed by contacting the hot glass in the form of a hot glass ribbon with the gaseous mixture during the float glass production process downstream of the float bath in the annealing lehr or in the gap between the float bath and the annealing lehr. The hot glass will usually be at a temperature in the range 200–600° C., preferably 200° C. to 575° C. and more preferably 225° C. to 500° C.

The deposition process of the present invention is most useful at temperatures of at least 350° C., and preferably at least 375° C. in order to ensure a high deposition rate. Because it is applicable at relatively low temperatures, it is especially suitable for use when a coating of silicon oxide is required to be applied to a ribbon of float glass outside the float bath, for example, in the annealing lehr, or in the gap between the float bath and the annealing lehr.

It is also especially useful when the temperature of the substrate is below about 525° C., when the rate of deposition achieved with alternative silane/oxygen systems begins to fall off significantly. Thus according to an especially preferred aspect of the invention, the glass is contacted with the silicon source/oxygen/ozone mixture with the glass at a temperature in the range 375° C. to 525° C.

The hot glass will normally be contacted with the gaseous mixture at substantially atmospheric pressure.

A wide variety of silicon compounds have been used or been proposed for use as a source of silicon in vapor deposition processes, including in particular silanes and siloxanes. The suitability of any particular silicon compound for use in the processes of the present invention may be determined by routine experiment. Those compounds which do not form coatings rapidly at the relatively low temperatures used in the processes of this invention are less preferred for use in float glass production processes although they may be useful in "off-line" coating processes where the coating time can be extended. Examples of suitable silanes include silane ($SiH_4$), disilane, alkyl silanes (for example, tri or tetramethylsilane, hexamethyldisilane, and other alkylsilanes having straight or branched chain substituted or unsubstituted alkyl groups with between 1 and 12 carbon atoms), especially dialkylsilanes preferably dimethylsilane; alkoxysilanes (for example methyltrimethoxysilane, dimethyldimethoxysilane and other alkyl alkoxysilanes having substituted or unsubstituted straight or branched chain alkyl groups with between 1 and 12 carbon atoms) especially tetra(alkoxy)silanes such as tetraethoxy silane (TEOS); di(alkoxy)silanes such as diacetoxyditertiary butoxy silane and oligomeric silanes especially oligomeric alkoxysilanes such as ethylsilicate 40. Examples of suitable siloxanes include hexa (alkyl) disiloxanes such as hexamethyldisiloxane and cyclic siloxanes especially the tetra (alkyl) cyclotetrasiloxanes such as tetramethylcyclotetrasiloxane and the octa (alkyl) cyclotetrasiloxanes such as octamethylcyclotetrasiloxane (OMCTS). A silicon halide, for example silicon tetrachloride, may be used as the source of silicon. The source of silicon may comprise a mixture of two or more silicon compounds.

The preferred alkoxysilane, tetraethoxysilane, undergoes pyrolysis with oxygen to produce silane at decomposition rates practically useful for on-line coating of glass only at temperatures of above 650° C. The deposition rate can be increased by using a plasma enhanced or low pressure CVD technique, but neither is suitable for commercial use on a continuous glass ribbon. Surprisingly, the enrichment of the oxygen with only a small proportion of ozone enables silicon oxide coatings with a high ratio of oxygen to silicon (about 2, providing a coating with a refractive index of 1.5 or less) to be deposited on hot glass at temperatures at least as low as 375° C. at a rate sufficient for practical use in the on-line coating of glass at substantially atmospheric pressure i.e. without the need to use a vacuum or low pressure method such as sputtering which would be impractical for commercial on-line application.

A gas stream comprising oxygen enriched with ozone suitable for use in the processes of this invention may conveniently be prepared by passing an oxygen stream through an ozone generator. Ozone generators of this type are available as articles of commerce and are able to produce a range of concentrations of ozone in the oxygen stream. In a preferred embodiment of the present invention, an oxygen stream enriched with ozone produced from a conventional ozone generator is mixed with a second gas stream containing at least one source of silicon in a carrier gas to form a gaseous mixture which is contacted with the hot glass. The precise concentration of ozone in the gaseous mixture is not normally critical, and depending on the concentration of silicon compound used, increasing the ozone concentration in the oxygen stream beyond 1% by weight, based on the total weight of oxygen and ozone in the oxygen stream, may give little or no increase in the rate of deposition. Indeed, we have found that, beyond a certain level, increasing the ozone concentration in the gaseous mixture may lead to a reduced deposition rate, presumably because competing reactions and especially competing reactions in the gas phase resulting in powder formation, become more significant at high ozone concentrations. Thus, for any particular conditions used, the ozone concentration in the gaseous mixture will be adjusted to optimise the deposition rate. Typically this will involve using an ozone concentration (in the oxygen stream before mixture with the source of silicon in the carrier gas) such that the oxygen is enriched with 0.5 to 10% by weight of ozone, especially wherein the oxygen is enriched with 0.5 to 5% by weight of ozone, and in a molar ratio of ozone to silicon source compound in the gaseous mixture not greater than 1:1, and preferably in the range 0.005:1 to 0.4:1, especially 0.05–0.2:1. A low ozone concentration in the gaseous mixture is advantageous because although higher ozone concentrations (up to a certain level) result in denser films, they also tend to promote gas phase reactions under certain coating conditions. Furthermore ozone is toxic, and a low concentration of ozone is safer.

The ozone/oxygen gas is preferably mixed with the carrier gas and the vapourised source of silicon before the gases contact the hot glass surface. This mixing is preferably effected immediately before the gases contact the glass in order to reduce any side reactions before coating takes place.

The invention is illustrated but not limited by the following Examples. In the Examples gas volumes are stated at room temperature and pressure (i.e. approximately 20° C. and 1 atmospheric pressure) unless otherwise indicated. Volumes of precursors liquid at room temperature are liquid volumes before vaporisation. Ozone was produced using commercial ozone generators (Peak Scientific OZ06, Astex AX8100 or Wedeco Ltd. SWO30) from flowing oxygen gas. Unless otherwise stated, ozone concentrations are the weight (in $g/m^3$) of ozone or the percent weight of ozone in oxygen in the oxygen stream produced by the generator. The oxygen enriched with ozone having this concentration was subsequently mixed with carrier gas containing the source of silicon to form the gaseous mixture.

EXAMPLES 1–2

In these, preferred, Examples a silicon oxide coating was applied to one edge of a moving ribbon of float glass in the annealing lehr during the production process, using a laminar flow coating process as described and illustrated in UK patent 1 507 996 B, with a coating chamber opening onto the glass from above and having a length of 150 mm in the direction of ribbon advance and a width of 100 mm. The glass was clear float glass with a ribbon thickness of 1.1 mm advancing at a ribbon speed of 358 metres per hour, and the coating gas was applied where the glass temperature was in the range 485–510° C. In Example 1 the source of silicon used was tetraethoxysilane (TEOS). Nitrogen carrier gas was passed through a TEOS bubbler. The amount of TEOS in the nitrogen gas stream was controlled by varying the temperature of the TEOS in the bubbler by means of a hotplate. The vapor pressure of TEOS varies with temperature in a known manner. The partial pressure of TEOS could therefore be controlled by varying the temperature of the TEOS in the bubbler. The typical flow rate of the nitrogen carrier gas was 1 litre/minute. The amount of TEOS used was calculated using the change in liquid volume in the bubbler. From 1.25 to 1.5 millilitres/minute of TEOS (measured as a liquid volume) were delivered. The resulting gaseous stream of TEOS in nitrogen carrier gas at 110° C. was admixed with a stream of oxygen (typical flow rate 1 litre / minute) containing about 1% by weight of ozone, in the coating chamber. The molar ratio of ozone to TEOS was approximately 0.05:1.

The resulting coating, which was found to be of silica of refractive index 1.46 and with good smoothness and uniformity (when examined using a scanning electron microscope), had a thickness of 450 Å corresponding to a deposition rate of about 300 Å per second. Example 2 was conducted under the same conditions as Example 1 except that octamethylcyclotetrasiloxane (OMCTS) was used as the silicon source, but at the same rate of supply as used for TEOS in Example 1, the molar ratio of ozone to OMCTS being approximately 0.06:1. The coating thickness in this case was somewhat less at 350–400 Å than that observed in Example 1, but the coating was again of silica of refractive index 1.46, and with good smoothness and uniformity when examined by scanning electron microscopy and atomic force microscopy (comparative SEM and AFM).

EXAMPLE 3–7

In each of these examples, a sample of 4 mm thick clear float glass of area approximately 50 square centimetres was heated on a graphite heater in a silica tube reactor and contacted with a gaseous mixture of an alkoxysilane and oxygen enriched with ozone which was passed through the silica tube over the glass sample. The carrier gas containing the source of silicon and the oxygen stream enriched with ozone were mixed as close as possible to the hot glass to alleviate pre-reaction and powder production.

The gaseous mixtures were prepared by injecting liquid tetraethoxysilane (TEOS) into an evaporator, where it was evaporated in a stream of nitrogen gas and carried by the nitrogen through heated tubing to mix with a stream of oxygen enriched with ozone just before being introduced into the reactor. The oxygen enriched with ozone was produced using an ozone generator (Peak OZ06 for ozone concentrations below 2.5% by weight and Astex AX8100 for ozone concentrations above 2.5% by weight). The molar ratio of ozone to TEOS in the gaseous mixture was approximately 0.07: 1.

In each Example, deposition was continued for 15–20 seconds. After deposition the flow of reactant gases was stopped and the sample allowed to cool under a flow of nitrogen. Typically it took approximately 60 minutes for a sample to cool to room temperature. After cooling the samples were removed and the thickness of the coatings measured, after appropriate etching treatment with 2% hydrofluoric acid, using a stylus technique (a Dectak-II profilometer), and/or scanning electron microscopy. The measured thickness of the coating and deposition time were used to calculate the deposition rate. For each Example, the substrate temperature, composition of the gas mixture and deposition rate are indicated in Table 1. The composition of the coatings were determined for representative samples by Auger profiling with results indicating that the coatings were composed of silicon dioxide with a slight excess of oxygen (25–30% Si, 65–70% O). However, Auger profiling does have associated uncertainties and can be affected by interactions with the glass surface. The ratio of silicon:oxygen is consistent with coatings of silicon dioxide, the apparent oxygen excess probably indicating that the coatings are porous. The refractive index of the coatings (general appearance of the coated glass) was used to monitor the coating process.

As shown in Table 1 the deposition rate of the silica coatings increased rapidly between deposition temperatures of 375° C. and 475° C. Above 475° C. the rate of increase in deposition rate is slower. A surprising result is that the deposition rate even at 375° C. is reasonably high as shown in Example 3. This is important for the formation of silica coatings during glass production.

Comparative Examples A, B and C were carried out under similar conditions to Examples 5–7, but in the absence of ozone, the conditions used and deposition rates achieved being as shown in Table 2. When the Examples are compared with the Comparative Examples the improved deposition rate achieved using ozone in the vapor are apparent. In Example 5 compared to Comparative Example A for deposition at 475° C., the deposition rate of the coatings from the ozone containing vapor was 100 Å/s compared to 20 Å/s, and there is a similar improvement in Examples 6 and 7 when compared to Comparative Examples B and C.

value. The deposition rate continues at approximately the same level until the concentration of ozone is 8 wt % in Example 15. Above 8 wt %, Example 16, the deposition rate drops significantly, presumably because pre-reaction occurs in the gas phase.

It will be appreciated that at higher temperatures there are likely to be higher deposition rates, and it is also likely that the ozone concentration required to reach the saturation point (that is the level at which the deposition rate is substantially independent of ozone concentration), and the concentration of ozone above which the deposition rate drops significantly, will be higher. The higher the ozone concentration, the better the surface quality and film density (roughly estimated from variation in the etching rate) of the deposited coatings. Where no ozone is supplied, as in the Comparative Examples, the optical and surface quality of the coating, even at 575° C., is not sufficiently good for commercially useful products.

TABLE 1

| Example | Substrate Temperature/° C. | TEOS */ml/min | $N_2$ * * L/min | $O_2$ *** L/min | $O_3$ wt % | Deposition Rate Å/s |
|---|---|---|---|---|---|---|
| 3 | 375 | 2.2 | 5–5.5 | 1 | 2.5 | 30 |
| 4 | 425 | 2.2 | 5–5.5 | 1 | 2.5 | 67.5 |
| 5 | 475 | 2.2 | 5–5.5 | 1 | 2.5 | 100 |
| 6 | 525 | 2.2 | 5–5.5 | 1 | 2.5 | 102.5 |
| 7 | 575 | 2.2 | 5–5.5 | 1 | 2.5 | 125 |

* by liquid injection
** Variation of nitrogen flow rate over this range appeared to have little effect on the deposition rate.
*** Approximate flow rate

TABLE 2

| Comparative Example | Temperature/° C. | TEOS/ml/min | $N_2$ L/min | $O_2$ L/min | $O_3$ wt % | Deposition Rate Å/s |
|---|---|---|---|---|---|---|
| A | 475 | 2.2 | 5–5.5 | 1 | 0 | 20 |
| B | 525 | 2.2 | 5–5.5 | 1 | 0 | 25 |
| C | 575 | 2.2 | 5–5.5 | 1 | 0 | 25 |

In each case, a silica coating identified by Auger profiling or refractive index was deposited, at the deposition rate shown in Table 3.

EXAMPLE 8–16

These Examples were carried out under the same conditions as Example 7 and Comparative Example C, except that the concentration of ozone used was varied from 0.29% by weight (Example 8) to 10.88% by weight (Example 16). The molar ratio of ozone to TEOS was between approximately 0.01:1 (Example 8) to approximately 0.3:1 (Example 16).

In each case, a silica coating identified by Auger profiling or refractive index was deposited, at the deposition rate shown in Table 3.

Referring to Table 3, it is immediately apparent that ozone in the gas stream leads to improvement in the deposition rate, even when the concentration of ozone is very low, as in Example 9. With further increase in the ozone concentration the deposition rate continues to increase, but at a slower rate, as shown in Examples 10, 11 and 12. This effect is thought to be because most TEOS has been oxidized at this level of ozone, that is, the concentration of TEOS is the rate limiting

EXAMPLES 17–21

These Examples were carried out under the same conditions as Example 7 except for the flow rate of TEOS. The conditions for these Examples are shown in Table 4. The molar ratio of ozone to TEOS varied between approximately 0.4:1 (Example 17) to approximately 0.05:1 (Example 21). The flow rate of TEOS was controlled by a motorized syringe injecting controllable amounts of TEOS into the evaporator. As the delivery rate of liquid TEOS is increased from 0.4 ml/min to 3.4 ml/min the deposition rate also increases as shown in Examples 17 to 20. When the TEOS delivery rate is 3.4 ml/min in Example 20 the deposition appears to have reached saturation since further increase in the TEOS delivery rate, as shown in Example 21 does not increase the deposition rate. After saturation any further increase in the TEOS concentration is believed to result in partial oxidation of TEOS and a decrease in material efficiency. These Examples and Examples 8–16 show that an increase in either ozone or TEOS concentration can enhance the deposition rate until a saturation point is reached. The choice of conditions, in practical application, has to be judged in balance between deposition rate and other related effects including the cost of raw materials.

EXAMPLES 22–29

These Examples were conducted using the same apparatus and under similar conditions to Examples 1 and 2. The gaseous mixture was applied where the glass temperature was in the range 450–540° C.

The source of silicon in Examples 22–29 was OMCTS.

Table 5 describes the volume of OMCTS used per minute, the flow rates of nitrogen and oxygen, and the concentration of ozone in the oxygen stream.

EXAMPLES 30–34

These Examples were conducted using the same apparatus and under similar conditions to Examples 3–7. The source of silicon was OMCTS.

The flow rate of oxygen was 2L/min enriched with 5.7g/m² ozone (measured by an ozone meter H1 obtained from IN USA Inc.). The liquid precursor was injected into nitrogen carrier gas (flow rate 2L/min) at 0.4 ml/min (liquid volume). The nitrogen carrier gas was mixed with 1.4L/min of helium before injection of the liquid source of silicon. The lines to the reactor were heated to 110° C.

The temperature of the glass substrate during deposition, and the deposition time are described in Table 6.

The process of the invention enables silica coatings of good smoothness and uninformity to be deposited at high rates especially below float bath temperatures, so that silic coatings may conveniently be applied to a ribbon of float glass in the annealing lehr or lerh gap (facilitating the application of a silica coating over an earlier coating applied in the float bath). Little or no undesirable pre-reaction is observed, and powder generation is not a problem. The gases used can thus be pre-mixed before introduction to the coating chamber adjacent the glass, enabling a laminar flow coating process to be used, and with high conversion efficiencies apparently possible. Moreover alkoxysilanes such as TEOS can be used; such compounds have good chemical stability and ease of handling and are readily available at reasonable costs.

TABLE 3

| Example | Comparative 3 | 8 | 9 | 10 | 11 | 12 | 13 | 14 | 15 | 16 |
|---|---|---|---|---|---|---|---|---|---|---|
| Ozone Concentration (% net) | 0 | 0.29 | 0.87 | 1.74 | 2.74 | 4.08 | 5.14 | 6.80 | 8.16 | 10.88 |
| Deposition rate Å/s | 20 | 8 | 106 | 107 | 115 | 123 | 113 | 117 | 117 | 75 |

TABLE 4

| Example | 17 | 18 | 19 | 20 | 21 |
|---|---|---|---|---|---|
| TEOS ml/min | 0.4 | 1.0 | 2.2 | 3.4 | 4.6 |
| Deposition rate Å/s | 38 | 70 | 125 | 145 | 142 |

TABLE 5

| Example | Vol of OMCTS ml/min | $N_2$ L/min | $O_2$ L/min | $O_3$ art conc (g/m³) |
|---|---|---|---|---|
| 22 | 1.5 | 4 | 2.5 | 5.7 |
| 23 | 1.0 | 4 | 2.5 | 6.3 |
| 24 | 0.8 | 4 | 2.5 | 7.0 |
| 25 | 2 | 4 | 2.5 | 5.1 |
| 26 | 1.5 | 4 | 2.5 | 14.7 |
| 27 | 1.5 | 4 | 2.5 | 22.8 |
| 28 | 1.5 | 4 | 2.5 | 0 |
| 29 | 1.5 | 4 | 1.5 | 10.2 |

TABLE 6

| Example | Substrate Temperature/° C. | Deposition Time/sec |
|---|---|---|
| 30 | 525 | 40 |
| 31 | 500 | 40 |
| 32 | 475 | 40 |
| 33 | 450 | 40 |
| 34 | 350 | 40 |

What is claimed is:

1. A method of depositing a silicon oxide coating on hot glass at a temperature of below 600° C. comprising:
   providing a hot glass,
   forming a gaseous mixture comprising oxygen enriched with ozone and a source of silicon selected from the group consisting of tetraethoxysilane and octamethylcyclotetrasiloxane, and contacting the hot glass with the gaseous mixture, thereby depositing a silicon oxide coating on the hot glass, wherein the deposited silicon oxide coating has a refractive index of 1.5 or less.

2. A method as claimed in claim 1 wherein the hot glass is at a temperature in the range 200° C. to less than 600° C.

3. A method as claimed in claim 1 wherein the hot glass is at a temperature in the range 200° C. to 575° C.

4. A method as claimed in claim 1 wherein the hot glass is at a temperature in the range 225° C. to 500° C.

5. A method as claimed in claim 1 wherein the hot glass is at a temperature in the range 375° C. to 525° C.

6. A method as claimed in claim 1 wherein the source of silicon comprises a mixture of two or more silicon compounds.

7. A method as claimed in claim 1 wherein the oxygen is enriched with 0.5 to 5% by weight of ozone.

8. A method as claimed in claim 1 wherein the molar ratio of ozone to the source of silicon in the gaseous mixture is in the range 0.01:1 to 0.4:1.

9. Glass coated with a silicon oxide coating by a method as claimed in claim 1.

* * * * *